United States Patent [19]
Gard

[11] Patent Number: 4,578,998
[45] Date of Patent: Apr. 1, 1986

[54] MICROWAVE MOISTURE MEASUREMENT
[75] Inventor: George E. Gard, Columbia, Pa.
[73] Assignee: Armstrong World Industries, Inc., Lancaster, Pa.
[21] Appl. No.: 709,646
[22] Filed: Mar. 8, 1985
[51] Int. Cl.[4] .............................. G01R 27/04
[52] U.S. Cl. ......................... 73/336; 73/335; 374/142
[58] Field of Search ............. 73/159, 335, 336, 336.5, 73/73; 374/122, 142; 324/58.5 A, 61 R; 250/359.1, 390 D, 341

[56]                References Cited
U.S. PATENT DOCUMENTS
3,644,826  2/1972  Cornetet, Jr. ................... 250/359.1
4,484,133 11/1984  Riggin .......................... 324/58.5 A
4,485,284 11/1984  Pakulis ............................. 73/73

Primary Examiner—Charles Frankfort
Assistant Examiner—David R. Schuster

[57] ABSTRACT

A moisture content measuring system for sheet material which uses microwave radiation. Two pairs of microwave radiators and receivers are combined with surface and below surface temperature measuring sensors to furnish data to a computer which interprets the data and yields moisture readings. Each pair of microwave radiator and receiver straddles the sheet test sample and checks microwave transmission through the sample and reflected from it, but the two radiators are cross polarized so that signal interchange between them is avoided.

6 Claims, 1 Drawing Figure

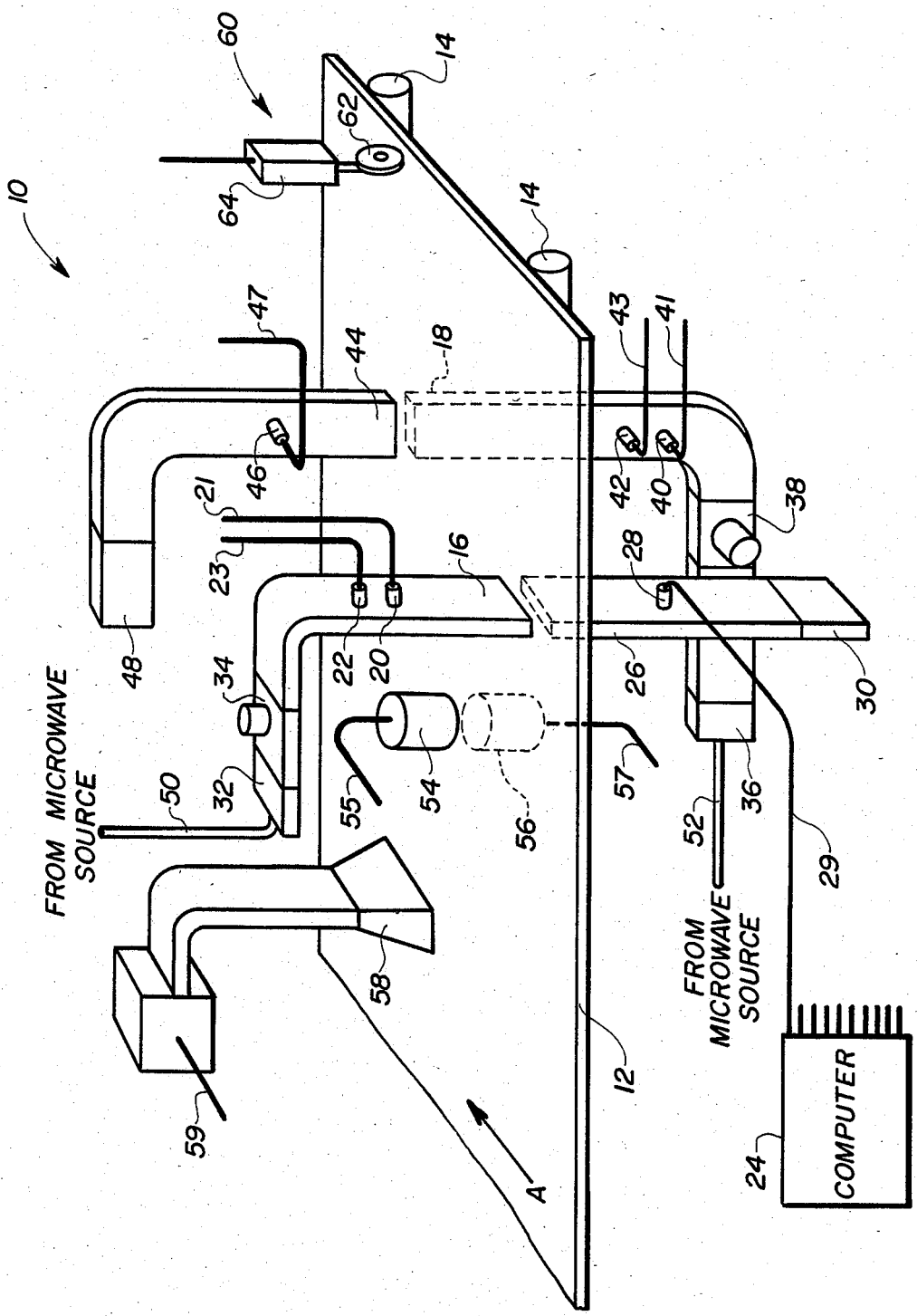

MICROWAVE MOISTURE MEASUREMENT

SUMMARY OF THE INVENTION

This invention deals generally with the application of radiant energy to material inspection, and more specifically with the use of microwave radiation to measure the moisture content of wood and other dielectric materials as they move along a processing line.

Microwave inspection of materials for moisture content has been suggested by U.S. Pat. No. 3,644,826 by Cornetet which accomplishes the task by evaluating the energy transmitted by the material and that scattered by it. However, such a system is subject to numerous problems, particularly those caused by changes in the test material's transmission characteristics due to temperature of the material and temperature differential through the material. Moreover, typical materials have localized variations, the effects of which cannot be recognized by any measurement system which depends on a single localized sensor.

The present invention provides an accurate, high speed, continuous production line measurement system which overcomes the problems of a single sensor location, but also avoids the problem of cross-talk, the interchange of radiation between the radiator of one station and the receiver of another station. Furthermore, temperature sensors for both surface readings and below surface depths are included in the present invention to better interpret the microwave signal results with regard to temperature related phenomena.

The present invention also uses a computer to interpret the great quantity of data generated and thus permits the system to operate both continuously and at high production speeds, which would be impossible if the operator were required to evaluate the data.

The moisture content evaluator of the present invention is constructed with two microwave radiators located near each other past which the material to be tested moves while supported on rollers. These two radiators are cross polarized to each other and one irradiates the bottom surface of the test material while the other irradiates the top.

Each radiator has associated with it two microwave receivers to capture the radiation transmitted through the test material and that reflected from it. One receiver structure for each radiator is directly opposite the radiator but located on the opposite side of the test material so that it receives only the radiation transmitted through the test material. The other receiver is located within the same waveguide structure as the radiator and therefore receives radiation reflected from the material. This arrangement places one radiator on each side of the material and a receiver for each radiator on each side of the material. Since the sets of radiators and receivers are relatively close in order to simultaneously test the same region of the test material and to be able to test material of narrow width, there is some danger that each receiver will receive not only its own radiator's signal, but also the signal from the other radiator.

In order to overcome this problem without the need for two microwave sources of different frequencies the radiators are first located on opposite sides of the material and also the sets are oriented so that they are cross polarized to each other. Thus one radiator, for instance the one located under the test material, is oriented so that its H plane is parallel to the direction of motion of the test material and the other radiator is oriented so that its H plane is perpendicular to the test material's movement. The matching receiver structures, being in the same orientation as their respective radiators, are therefore cross polarized to the other radiator's signal and are little affected by it. Therefore, despite the proximity of the two irradiating systems and the fact that they operate at the same frequency, they are not affected by each other.

Mere measurement of microwave transmission characteristics of test materials has, however, been found to be unreliable to properly measure moisture content. Since the microwave transmission characteristics and the moisture retention of most materials vary with temperature, it appears that material temperature is vital to evaluate the actual moisture present. To that end the present invention also reads material temperature, not at one location, but at three.

The moisture measurement system uses independent sensors to measure the temperature of the material's top surface, the bottom surface and an interior point below surface depth. The data thus accumulated is fed, along with the information from the microwave receivers to a data reduction device, which in the preferred embodiment is a computer.

The use of a computer permits the continuous accumulation of the several readings including six from the microwave system and three from the temperature sensors, along with location of the readings on the test material, to be interpreted into valid moisture content indiction on a moment-to-moment basis, even in a production line situation.

The actual evaluation of moisture content is not done on the basis of some theoretical calculation, but rather by testing materials with known moisture content and recording that data for comparison to the results of unknown materials being tested. This comparison is also advantageously performed quickly by the computer.

The apparatus of the present invention therefore supplies continuous moisture content reading in a production line environment with those reading accurately indicating the moisture present in a manner which directly compares to previous methods of measurement, despite the fact that the previous methods were essentially sampling methods testing only occasional pieces and furnishing results only after long delay.

BRIEF DESCRIPTION OF THE DRAWINGS

The FIGURE is a perspective view of the preferred embodiment of the invention showing the several temperature sensors and the microwave radiators and receivers.

DETAILED DESCRIPTION OF THE INVENTION

The FIGURE depicts the preferred embodiment of moisture measurement apparatus 10 of the present invention in which sample sheet 12 moves in direction A over rollers 14 and through various measuring devices.

Two microwave radiators 16 and 18 are located above and below sheet 12, respectively, and these radiators are cross polarized relative to each other to minimize the effect of each on the other. Radiator 16, above sheet 12, contains two power measuring devices, detector 20 which measures the power delivered to radiator 16, and detector 22 which measures the power reflected back into radiator 16 from sheet 12. Electrical signals representing these power levels are fed to computer 24 by cables 21 and 23 attached to the detectors.

Receiver 26 located across sheet 12 from radiator 16, intercepts the microwave power transmitted through sheet 12. This power level is converted into a proportional electrical signal by detector 28 and is fed to computer 24 by cable 29. Waveguide termination 30 is matched to the system so that no reflection occurs to cause any error.

The original source for the microwave signal is a typical microwave generator (not shown) fed into adapter 32. Phase shifter 34 is then adjusted to maximize the power being delivered to sheet 16, as indicated by detector 20.

The system of measurement associated with radiator 18 operates in the same manner. Microwave power is fed from the source (not shown) into adapter 36, adjusted by phase shifter 38 and the forward power measured by detector 40, with the reflected power measured by detector 42, and sent to computer 24 by cables 41 and 43.

On the other side of sheet 12, the microwave radiation transmitted through sheet 12 is intercepted by receiver 44, measured by detector 46 and sent to computer 24 by cable 47. The signal is absorbed in that arm by termination 48.

The signal source in the preferred embodiment generates 20 milliwatts of power at 5.85 GHZ at each of two outputs. This power is transmitted to adapters 32 and 36 by cable 50 and 52 so that long runs of waveguide are not required and it enables convenient physical adjustment of the waveguide test apparatus.

Three temperature measurements are taken by the preferred embodiment. Surface measurements are taken on the top surface by temperature measurement means 54 and sent to computer 24 by cable 55, while temperature measurement means 56 reads the bottom surface temperature and communicates with computer 24 by cable 57. In the preferred embodiment both surface temperature measurement devices are passive infrared thermopiles with cold junction cooling.

Temperature measurements of the internal volume of sheet 12 are taken by scanner 58, which measures the temperature below the top surface and sends it to computer 24 by cable 59.

It can readily be appreciated that the nine sources of signal previously enumerated generate a considerable amount of data, particularly if being used on a continuous production line. Computer 24 is therefore more than a mere convenience. It is rather a necessity to accommodate to continuous acquisition of a high volume of data. While individual laboratory samples could be tested by manually recording and comparing data, production speeds require the use of some means to acquire, record and compare the data at speeds which make manual recording unsatisfactory. A typical production speed for the preferred embodiment is 60 feet per minute and at that speed one sample period covers approximately one inch of running length. It would therefore be quite practical to produce readings at the rate of one per second.

Computer 24 not only permits this radid acquisition of data, but also permits instantly computing the moisture level from a formula developed from the data from previous moisture content evaluations. These previous sets of data were secured with individual test samples for which microwave and temperature data were secured and then the moisture measured by conventional methods. Generally this test checks against previous methods to an accuracy of approximately one percent. It would also be practical, by use of the computer, to compare new data directly to the previous data and thus measure moisture content.

The preferred embodiment shown in the FIGURE also includes material marking device 60. In the preferred embodiment this is cutting wheel 62 lowered onto sheet 12 by solenoid 64. This action is timed and initiated by computer 24 as the various measuring devices are activated. The marking is used essentially to indicate the exact area in which a test is being run, so that sample verification by other means can be accomplished if desired. This marking device need not be a cutting wheel and could instead be a dye marker or other such device in the appropriate application.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

For example, other temperature measuring devices could be used.

What is claimed is:

1. An apparatus for measuring the moisture content of sheet material comprising:

sheet support means to locate a sheet to be tested in a particular plane;

microwave source means;

first radiator means connected to and receiving power from the microwave source means and radiating power transverse to one of the two planar surfaces of the test sheet;

first receiver means aligned with the first radiator means but located on the other side of the test sheet from the first radiator means;

second radiator means connected to and receiving power from the microwave source means and radiating power transverse to the second planar surface of the test sheet, and oriented so that its radiation is cross polarized relative to the radiation of the first radiator means;

second receiver means aligned with the second radiator means but located on the other side of the test sheet from the second radiator means;

first detector means, connected to the first radiator means, measuring the power applied to the test sheet by the first radiator means;

second detector means, connected to the first radiator means, measuring the power reflected from the test sheet back to the first radiator means;

third detector means, connected to the first receiver means, measuring the power from the first radiator means transmitted through the test sheet;

fourth detector means, connected to the second radiator means, measuring the power applied to the test sheet by the second radiator means;

fifth detector means, connected to the second radiator means, measuring the power reflected from the test sheet back to the second radiator means;

sixth detector means, connected to the second receiver means, measuring the power from the second radiator means transmitted through the test sheet;

first temperature measuring means located near one surface of the test sheet and measuring the temperature of one planar surface of the test sheet;

second temperature measuring means located near the second surface of the test sheet and measuring the temperature of the second planar surface of the test sheet;

third temperature measuring means located near one surface of the test sheet and measuring the temperature of the test sheet at a level between its two exterior surfaces; and data acquisition means, connected to and receiving electrical signals from all six detector means and all three temperature measuring means, factoring the electrical signals received to produce a measurement of moisture content in the test sheet, and displaying the moisture content for the test sheet.

2. The moisture content measuring apparatus of claim 1 wherein the data acquisition means is a computer.

3. The moisture content measuring apparatus of claim 1 further including a microwave phase adjustment means inserted between the microwave source and the first radiator means to permit maximization of the power applied to the test sheet.

4. The moisture content measuring apparatus of claim 1 further including a second phase adjustment means inserted between the microwave source and the second radiator means to permit maximization of the power applied to the test sheet.

5. The moisture content measuring apparatus of claim 1 wherein the first temperature measuring means is a passive infrared thermopile.

6. The moisture content measuring apparatus of claim 1 wherein the second temperature sensing means is a passive infrared thermopile.

* * * * *